United States Patent [19]

Dunkley et al.

[11] 4,079,402

[45] Mar. 14, 1978

[54] ZENER DIODE INCORPORATING AN ION IMPLANTED LAYER ESTABLISHING THE BREAKDOWN POINT BELOW THE SURFACE

[75] Inventors: James L. Dunkley, Santa Clara; James E. Solomon, Saratoga, both of Calif.

[73] Assignee: National Semiconductor Corporation, Santa Clara, Calif.

[21] Appl. No.: 377,610

[22] Filed: Jul. 9, 1973

[51] Int. Cl.² .............................................. H01L 29/90
[52] U.S. Cl. ....................................... 357/13; 357/88; 357/89; 357/90; 357/91
[58] Field of Search ................. 317/235 T; 357/13, 89, 357/90, 91, 88

[56] References Cited

U.S. PATENT DOCUMENTS

| | | | |
|---|---|---|---|
| 3,354,364 | 11/1967 | Nakamura | 317/235 |
| 3,656,031 | 4/1972 | Bresee et al. | 357/89 |
| 3,717,516 | 2/1973 | Hatcher et al. | 357/13 |
| 3,723,830 | 3/1973 | Frederiksen et al. | 357/13 |

FOREIGN PATENT DOCUMENTS 1,959,817  6/1971  Germany .......................... 317/235 T

OTHER PUBLICATIONS

R. Warner et al., "Integrated Circuits-Design Prin. and Fab.", McGraw-Hill, 1965, pp. 65-67.

Primary Examiner—Stanley D. Miller, Jr.
Assistant Examiner—Joseph E. Clawson, Jr.
Attorney, Agent, or Firm—Gail W. Woodward; Willis E. Higgins

[57] ABSTRACT

A zener diode in which the anode region of a first conductivity material is formed by diffusion in a semiconductor body, a cathode region of a second conductivity material is formed by diffusion in the semiconductor body, and the two regions are bridged by a third region extending through the two regions, the third region being a shallow layer of ion implanted doping material of said first conductivity type. In one embodiment, the anode and cathode regions are spaced-apart; in a second embodiment the cathode region is formed within the anode region. The ion implanted layer has a concentration that peaks below the surface, thus establishing the breakdown point for the avalanching of the zener diode below the surface and removed from surface contaminants such as found in the oxide surface layer.

9 Claims, 10 Drawing Figures

Fig_5

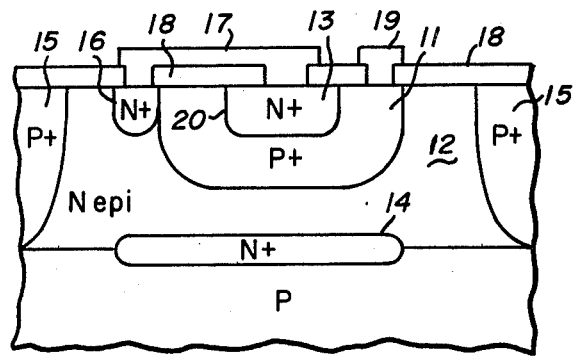
Fig_1 PRIOR ART
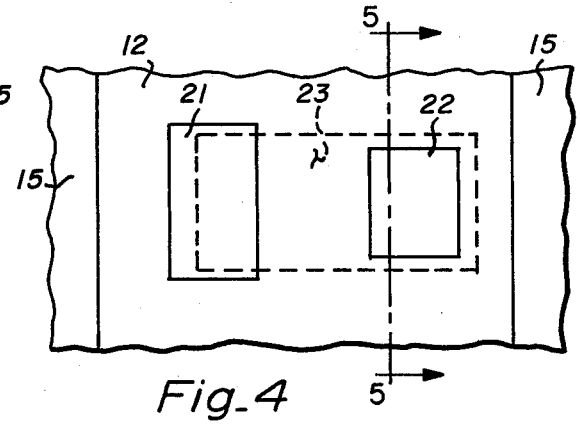
Fig_4
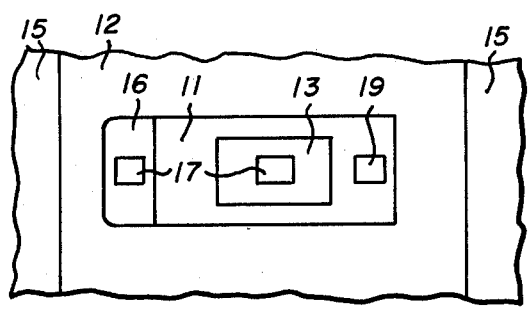
Fig_2 PRIOR ART
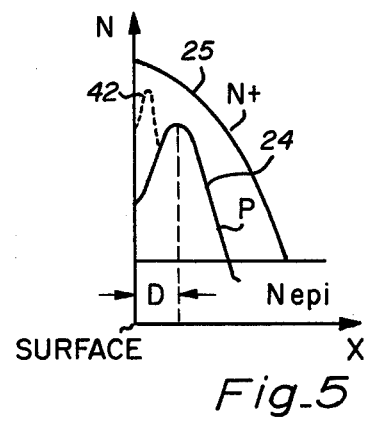
Fig_5
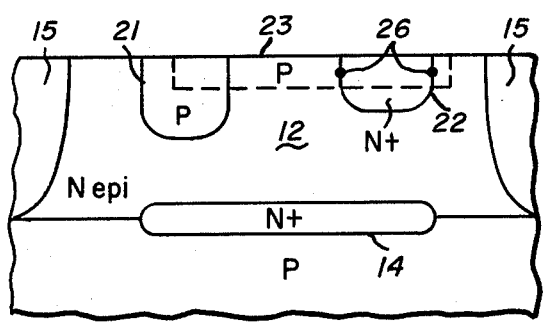
Fig_3
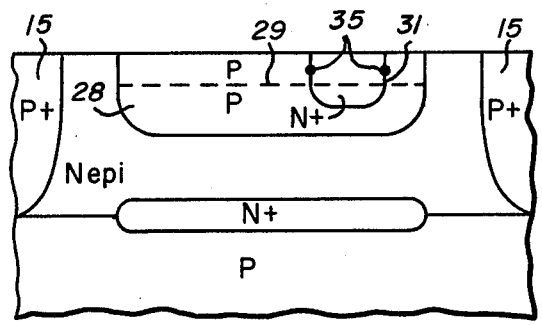
Fig_6

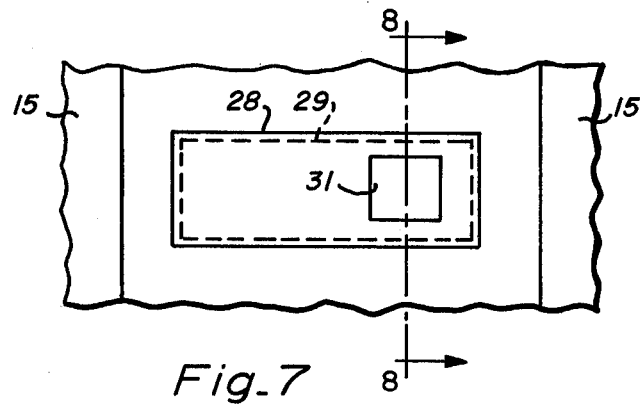
Fig_7
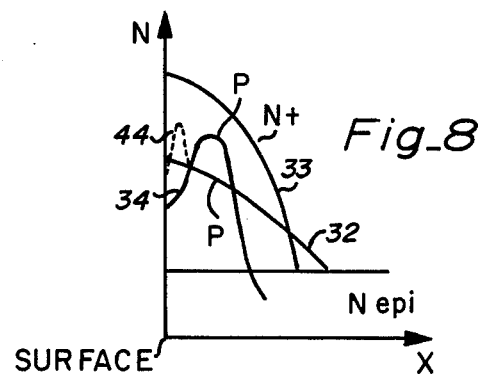
Fig_8
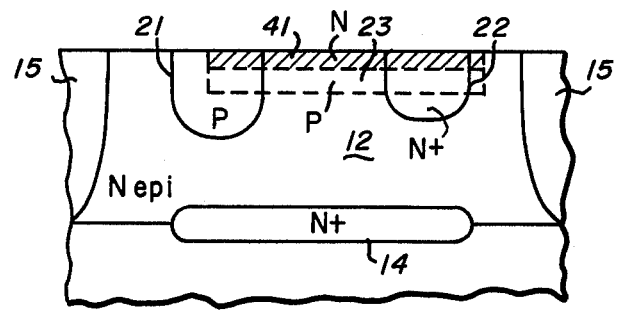
Fig_9
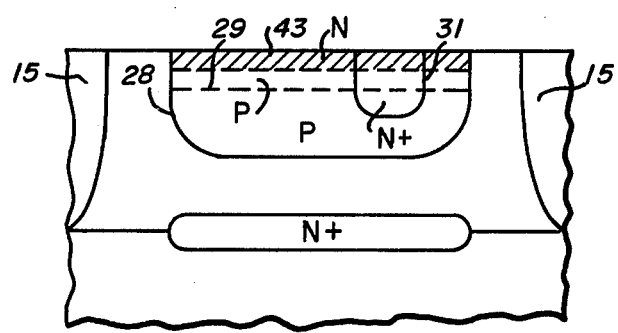
Fig_10

ZENER DIODE INCORPORATING AN ION IMPLANTED LAYER ESTABLISHING THE BREAKDOWN POINT BELOW THE SURFACE

BACKGROUND OF THE INVENTION

One conventional manner of fabrication of a zener diode on an integrated circuit is to form the zener diode during the same processing steps used to form the bipolar transistors on the silicon wafer. Referring to FIGS. 1 and 2, the P+ anode region 11 of the diode is formed in the N epitaxial region 12 during the base diffusion of the bipolar transistor and the cathode region 13 is formed during the emitter diffusion, the diode structure also including the N+ buried layer region 14 and the isolation regions 15. At the time of diffusion of the cathode region 13, an N+ contact region 16 is diffused into the N epitaxial layer 12. A metallic interconnect 17 extending over the oxide layer 18 connects the region 13 with the epitaxial layer contact 16; a metal contact 19 is also provided for the anode region 11. The contact 17 is connected to the positive source of voltage supply and contact 19 is connected to the negative side.

As the voltage across terminals 17 and 19 increases, a point is reached where the zener diode avalanches and the current rapidly increases from zero to some maximum level. A typical voltage at which avalanche occurs is 6–7 volts.

One major problem with such forms of zener diode is that the voltage at which the avalanche occurs drifts with time. This is due to the fact that the junction avalanche initially starts at the point where the junction 20 abutts the oxide layer 18, i.e. at the surface of the semiconductor body. There is a fringing of the electric field at this point along the surface of any factor that influences this electric field will influence the zener voltage. The oxide will usually contain contaminants, for example sodium atoms; these sodium atoms have a plus charge and are very mobile in the oxide 18 even at room temperature. If these sodium atoms come near the junction 20, they bend the depletion layers at the surface and affect the breakdown voltage. Therefore, the breakdown voltage is a function of the electric field at the surface and may increase as a function of time, and the circuit may drift out of specification existing at first use.

A second disadvantage is that the zener voltage is dependent on the diffusion depths and other parameters of the diffused areas 11 and 13, and these in turn are a function of the deposition steps used to make the other transistors on the IC. Therefore the zener diode specifications are principally determined by considerations other than good zener diode parameters.

BRIEF SUMMARY OF THE PRESENT INVENTION

The present invention provides a novel zener diode structure and method of fabrication wherein an ion implanted layer is used to establish the avalanche junction of the diode well below the surface of the device, whereby contaminants in the oxide layer at the surface have no effect on the avalanche voltage. The ion implantation technique permits the peak of the impurity concentration of the implant to occur below the surface, and breakdown occurs at this point of peak concentration and well below the surface.

In one embodiment of the invention, a first diffusion is made in the epitaxial region of a semiconductor body, for example a P type diffusion in an N epitaxial region during the base diffusion step in forming NPN transistors, and thereafter a second diffusion is made of a different conductivity type. This second diffusion is separated a distance from the first diffusion; in the particular example this second diffusion is an N+ diffusion made during the emitter diffusion step for the other transistors. After these two diffusions, a window is opened in a suitable mask which bares the two diffusion areas and the epitaxial region between the two depositions. A doping material of the first conductivity type, e.g. P type boron, is then made in the exposed region by the known ion implantation technique, the peak of concentration of such dopant occurring well below the surface of the semiconductor body. This layer of dopant extends into each of the two deposition regions and across the space therebetween. The two diffusion areas are each provided with associated metallic contacts and the device forms a zener diode. The avalanching for this zener diode occurs well below the surface and at the point of peak dopant in the ion implantation layer.

In a second embodiment, the deposition of the first conductivity type material is made over the entire area of the zener diode, and the deposition of the second material is made in one area of the first diffusion area. Thereafter, the buried layer of the first conductivity material is made in the first diffusion area and encompassing the second diffusion area. This buried layer is formed by the ion implantation technique and the peak concentration of this layer occurs well below the surface of the semiconductor body. The zener diode avalanching occurs at this peak concentration point and therefore occurs well below the surface of the semiconductor and unaffected by contaminants in the surface oxide.

BRIEF DESCRIPTION OF THE DRAWINGS

FIGS. 1 and 2 are cross-section and plan views, respectively, of a typical prior art zener diode.

FIGS. 3 and 4 are cross-section and plan views, respectively, of one embodiment of the zener diode of the present invention.

FIG. 5 is a plot of the impurity profile below the surface for the device of FIGS. 3 and 4 taken along section line 5—5 in FIG. 4.

FIGS. 6 and 7 are cross-section and plan views, respectively, of a second embodiment of the zener diode of the present invention.

FIG. 8 is a plot of the impurity profile for the device of FIGS. 6 and 7 taken along section line 8—8 in FIG. 7.

FIG. 9 is a cross-section view of a device similar to that of FIG. 3 showing a second ion implanted top layer.

FIG. 10 is a cross-section view of a device similar to that of FIG. 6 showing a second ion implanted top layer.

DESCRIPTION OF THE PREFERRED EMBODIMENTS

Referring now to FIGS. 3 and 4, one embodiment of the novel zener diode of the present invention comprises a semiconductor having an N epitaxial layer 12 on a P substrate with an N+ buried layer 14 therein. During the base diffusion for the other transistors on the semiconductor body, the P type diffusion region 21 which forms the anode is made in the epitaxial region 12. Thereafter and during the subsequent emitter diffusion step for forming the other transistors, an N+ diffusion area 22 which forms the cathode is made in the N epitaxial region 12 spaced from region 21. A suitable mask is then made to produce an opening overlapping the regions 21 and 22 as shown by the dotted line in FIG. 4 and then a buried layer 23 is formed in this region by the well known technique of ion implantation (see, for example the article by J. F. Gibbons, Proc. of IEEE, Vol. 56, page 295, 1968). Suitable electrical contacts (not shown) are then made with area 21 and area 22 by well known metallization when forming the other contacts and interconnects for the semiconductor.

An ion implantation apparatus of known type includes a means for applying a high voltage alternating electrical field, for example, 15 KEV, on a gas containing the doping atom desired, for example boron in the gas $BH_2$, to ionize the boron in the gas. The gas is accelerated through a mass separator including a magnetic field to separate out the ionized boron atoms and direct them through a linear accelerator with an accelerating potential of from 20 KEV to 150 KEV. Higher energies can also be used to advantage if made to be compatible with the process technology. The beam of positive boron atoms exits the accelerator and is swept over the silicon wafer to implant the boron ions in the region 23 defined by the opening in the mask. The beam of ionized boron atoms can be monitored very accurately so that the amount of boron atoms implanted and also the exact depth of the implant layer can be controlled very accurately by proper selection of the accelerating voltage. The impurity profile of the boron peaks at a point D below the surface as illustrated by the curve 24 in FIG. 5. The concentration (N) of the P implant is lower than the N+ concentration (curve 25) at depth D as shown in FIG. 5, and the zener breakdown occurs at depth D, which is typically $0.5\mu$ below the surface, and at the junction 26 of the N+ region 22 and the layer 23 as viewed in FIG. 3. A typical concentration for the N+ diffusion is $10^{21}/cm^3$ while the peak of the P implant is about $10^{18}$ to $10^{20}/cm^3$. The N epitaxial concentration is about $10^{15}$ or $10^{16}/cm^3$. Another way of stating the concentration of the P implant is by the Q number in atoms/$cm^2$, i.e. the total number of atoms in a column one cm by one cm extending vertically through the P layer, and this is typically $10^{13}$ to $10^{15}$ atoms/$cm^2$.

Another embodiment of the invention is shown in FIGS. 6 and 7 wherein the P diffusion 28 is made over the entire region to be occupied by the P implant layer 29 and the N+ plug 31. After the P diffusion 28, the N+ plug is diffused into a portion of region 28 and then the layer 29 of P type material is made by the ion implant technique. The profile of the dopants is shown in FIG. 8 as taken along section line 8—8 in FIG. 7. The concentration of P in area 28 is shown as trace 32, the concentration of N+ plug 31 is shown as trace 33, and the concentration of the ion implanted layer is shown as trace 34. It is seen that the ion implantation concentration peaks below the surface and the zener breakdown occurs at point 35 as shown in FIG. 6, i.e. about $0.5\mu$ below the surface.

Because of the light doping of the layer 23 of FIGS. 3 and 4 and the layer 29 of FIGS. 6 and 7, the impurities in the oxide layer overlaying the anode and cathode regions tend to produce instabilities in the device, including noise. It has been discovered that, by following the first ion implant layer with a second ion implant of the opposite conducting type material in a layer which peaks at a shallower depth, the noise of the device is substantially improved. In the examples given of a first ion implant of P type material, the second ion implant is of N type material, for example phosphorous.

The device of FIG. 3 is shown in FIG. 9 with this second ion implanted N layer 41 incorporated therein. The concentration of this layer is shown by the dotted line 42 in FIG. 5. The concentration of this layer peaks at about $0.2\mu$ and has a concentration of for example, $1 \times 10^{13}$ to $1 \times 10^{14}$ atoms/$cm^2$.

A similar ion implanted layer, when incorporated in the device of FIG. 6 provides the device of FIG. 10; the concentration curve for this layer 43 is shown by the dotted line 44 in FIG. 8.

These shallow ion implanted top layers are further described and claimed in U.S. patent application Ser. No. 377,611 filed July 9, 1973 by James Dunkley and Robert Dobkin entitled "Ion Impregnated Stabilizing Layer".

What is claimed is:

1. A subsurface breakdown zener diode on an integrated circuit structure including a diffused anode region of a first conductivity type material formed in the surface of a semiconductor body, a diffused cathode region of a second conductivity type material formed in the surface of said semiconductor body, and a third region extending through said anode and cathode diffused regions, said third region comprising a shallow layer of ion implanted doping material of said first conductivity type and having a lower impurity concentration than that of said diffused cathode region, the impurity concentration of said shallow layer peaking below the surface of said semiconductor body.

2. A zener diode structure as claimed in claim 1 wherein said first conductivity type material is P type and said second conductivity type material is N type.

3. A zener diode structure as claimed in claim 1 wherein said anode and cathode regions are formed in the surface of said semiconductor body in spaced-apart relationship, and said third region bridges across between said anode and cathode regions.

4. A zener diode structure as claimed in claim 3 wherein said first conductivity type material is P type and said second conductivity type material is N type.

5. A zener diode structure as claimed in claim 1 wherein said cathode region is formed within said anode region.

6. A zener diode structure as claimed in claim 5 wherein said first conductivity type material is P type and said second conductivity type material is N type.

7. A zener diode as claimed in claim 1 wherein said impurity concentration for said shallow layer peaks about $0.5\mu$ below the surface of said semiconductor body.

8. A zener diode as claimed in claim 1 wherein the impurity concentration for said diffused cathode region is typically $10^{21}/cm^3$ and the impurity concentration for said shallow layer is about $10^{18}$ to $10^{20}/cm^3$.

9. A zener diode as claimed in claim 8 wherein said impurity concentration for said shallow layer peaks about $0.5\mu$ below the surface of said semiconductor body.

* * * * *